United States Patent
Choi et al.

(10) Patent No.: US 6,188,104 B1
(45) Date of Patent: Feb. 13, 2001

(54) TRENCH DMOS DEVICE HAVING AN AMORPHOUS SILICON AND POLYSILICON GATE

(75) Inventors: Mun-Heui Choi; Dong-Soo Jeong, both of Kyunggi-do (KR)

(73) Assignee: Samsung Electronics Co., Ltd, Suwon (KR)

(*) Notice: Under 35 U.S.C. 154(b), the term of this patent shall be extended for 0 days.

(21) Appl. No.: 09/049,601

(22) Filed: Mar. 27, 1998

(30) Foreign Application Priority Data

Mar. 27, 1997 (KR) .................................................. 97-10691

(51) Int. Cl.[7] .................................................. H01L 29/76
(52) U.S. Cl. .................... 257/330; 257/332; 257/333; 257/335; 257/328; 257/374; 257/397; 257/520; 257/619; 257/622; 257/60; 257/127; 257/170
(58) Field of Search ................................. 257/330, 332, 257/333, 335, 328, 374, 397, 520, 619, 622, 60, 127, 170

(56) References Cited

U.S. PATENT DOCUMENTS

| 5,341,011 | * | 8/1994 | Hshieh et al. | 257/330 |
| 5,342,792 | * | 8/1994 | Yonehara | 437/24 |
| 5,656,843 | * | 8/1997 | Goodyear et al. | 257/329 |
| 5,843,819 | * | 12/1998 | Kellner et al. | 438/243 |
| 5,910,669 | * | 6/1999 | Change et al. | 257/339 |
| 5,915,180 | * | 6/1999 | Hara et al. | 438/270 |
| 5,929,481 | * | 7/1999 | Hshieh et al. | 257/328 |

* cited by examiner

Primary Examiner—Carl Whitehead, Jr.
Assistant Examiner—Matthew E. Warren
(74) Attorney, Agent, or Firm—Marger Johnson & McCollom, P.C.

(57) ABSTRACT

A trench DMOS device has a gate insulating layer on the bottom and sidewalls of the trench. The upper edges of the trench have an impurity injection region and are rounded. In addition, a first conductive layer is formed on the gate insulating layer, and a second conductive layer is formed on the first conductive layer and filled in the trench. The second conductive layer has different crystallization from the first conductive layer. As such the first conductive layer acts as a buffer between the gate insulating layer and the filled in second conductive layer. A method for fabricating a trench DMOS device includes the steps of forming an epitaxial layer on a semiconductor substrate. Then an impurity is injected into the epitaxial layer to form an impurity injection region. Then a trench is formed in the semiconductor substrate passing through the impurity injection region. Then a dry etching process is used to round the upper edges of the trench. Then an insulating layer is formed on the bottom and the sidewalls of the trench as the gate insulating layer. Then a first conductive layer is formed on the gate insulating layer, and a second conductive layer is formed on the first conductive layer and filled in the trench. The second conductive layer has different crystallization from the first conductive layer.

14 Claims, 7 Drawing Sheets

TRENCH DMOS DEVICE HAVING AN AMORPHOUS SILICON AND POLYSILICON GATE

FIELD OF THE INVENTION

The present invention relates to a semiconductor device, and more particularly to a TDMOS (Trench Double Diffused MOS or trench DMOS) device with a trench gate structure capable of reducing a leakage current thereof and improving an insulation characteristic of a gate oxide layer, and a method for fabricating the same.

BACKGROUND OF THE INVENTION

In a typical TDMOS device with a trench gate structure, a gate oxide layer is formed on the bottom and sidewalls of the trench, and a channel region between source and drain is formed on the sidewalls of the trench. A current flowing between the source and drain flows vertically along the sidewalls of the trench.

In this TDMOS device, if the trench is not formed with a smoothed shape at the bottom edges, or if the trench is formed having a vertical shape thereat, electric field can be concentrated there, and thereby a leakage current of the gate oxide layer is increased. As a result, the insulation characteristic of the gate oxide layer is deteriorated disproportionately.

It is difficult to fabricate a trench having a smoothed shape at an edge of bottom. A technique for addressing this problem has been disclosed in the invention entitled "TRENCH GATE METAL OXIDE SEMICONDUCTOR FIELD EFFECT TRANSISTOR" in U.S. Pat. No. 5,142,640.

Also, since the trench has a vertical shape even at the top edges thereof, the above-mentioned problem is caused. A technique for addressing this problem has been disclosed in the invention entitled "METHOD FOR FORMING CAPACITOR IN TRENCH OF SEMICONDUCTOR WAFER BY IMPLANTATION OF TRENCH SURFACE WITH OXYGEN" to Levy in U.S. Pat. No. 5,183,775 published in Feb. 2, 1993.

SUMMARY OF THE INVENTION

It is therefore an object of the present invention to provide an improved trench DMOS device which is capable of reducing a leakage current in a trench gate structure thereof, and a method for fabricating the same.

It is another object of the present invention to provide an improved trench DMOS device which is capable of improving an insulation characteristic of a gate oxide layer thereof, and a method for fabricating the same.

According to a first embodiment of the invention, there is provided a trench DMOS device comprising a semiconductor substrate having a trench therein. A gate insulating layer is formed on the bottom and sidewalls of the trench. A first conductive layer is formed on the gate insulating layer, and a second conductive layer is formed on the first conductive layer and filled in the trench. The second conductive layer has different crystallization from the first conductive layer. Accordingly the first conductive layer acts as a buffer between the gate insulating layer and the filled in second conductive layer. As a result, the gate insulating layer is less susceptible to distortion due to changes of grain of the second conductive layer.

According to a second embodiment, a trench DMOS device has a round shaped structure at the upper edges of the trench. This prevents the electric field from being concentrated in the gate oxide layer at the upper edges of the trench.

According to a third embodiment, a trench DMOS device has the features of both the first and second embodiments. Specifically, a conductive layer buffers the gate oxide layer from the filled in conductive layer, and the upper edges of the trench are rounded.

A method is provided according to the present invention for fabricating a trench DMOS device. The method comprises the steps of preparing a semiconductor substrate of a first conductivity type, and then forming on it an epitaxial layer of a second conductivity type that has a guard ring at a bottom thereof. Then an impurity is injected into the epitaxial layer to form an impurity injection region of the first conductivity type. Then a first and a second insulating layers are formed sequentially over the epitaxial layer. The second insulating layer is patterned to form a pattern. Then the first insulating layer and the epitaxial layer are etched sequentially using the pattern as a mask, to form a trench in the semiconductor substrate passing through the impurity injection region. Then a dry etching process is used to round the upper edges of the trench. Then a third insulating layer is formed on the bottom and the sidewalls of the trench. Then a first conductive layer is formed on the third insulating layer and a second conductive layer is formed on the first conductive layer and filled in the trench. The second conductive layer has different crystallization from the first conductive layer.

BRIEF DESCRIPTION OF THE DRAWINGS

The present invention will be described by way of exemplary embodiment, but not limitations, illustrated in the accompanying drawings in which like reference numbers denote similar elements, and in which.

DETAILED DESCRIPTION OF THE PREFERRED EMBODIMENT(S)

It should be understood that the description of this preferred embodiment is merely illustrative and that it should not be taken in a limiting sense.

First Embodiment

Figure 1:
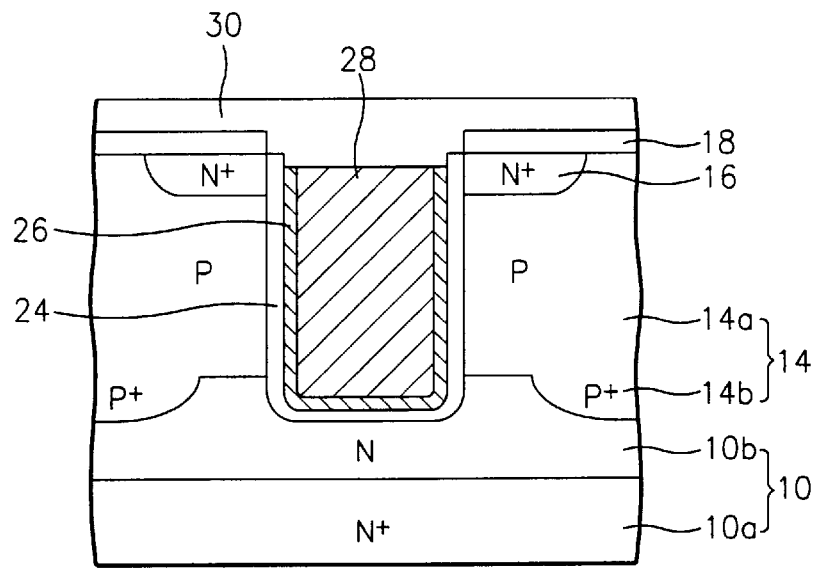
FIG. 1 is a cross-sectional view showing a trench DMOS device according to a first embodiment of the present invention.

FIG. 1 shows a novel trench DMOS device according to a first embodiment of the present invention.

Referring to FIG. 1, the trench DMOS device has a semiconductor substrate 10 of a first conductivity. In the particular embodiment, N+ and N type layers 10a and 10b are sequentially formed by impurity ions.

An epitaxial layer 14 is formed on substrate 10 by impurity ions. The epitaxial layer is of a second conductivity different from the first conductivity. A source region 16 of the first conductivity is formed by implanting impurity ions into epitaxial layer 14.

A trench is formed passing through source region 16 and epitaxial layer 14, and reaching N type layer 10b. The trench defines a bottom and sidewalls. Since FIG. 1 shows a cross section of the trench, two sidewalls opposite each other are shown. A gate oxide layer 24 is formed on the bottom and the sidewalls of the trench.

An amorphous silicon layer 26 is formed on gate oxide layer 24. A polysilicon layer 28 is formed on amorphous silicon layer 26, and filled in the trench. As a result, a trench gate structure for the trench DMOS device is formed.

As described immediately above, since the trench DMOS device has two conductive layers, i.e. amorphous silicon layer 26 and polysilicon layer 28 having different crystallization on gate oxide layer 24, distortion of gate oxide layer 24 can be considerably reduced.

Method for Fabricating the Device of the First Embodiment

A method for fabricating the trench DMOS device of FIG. 1 is described with reference to FIGS. 2A through 2C.

Figure 2A:
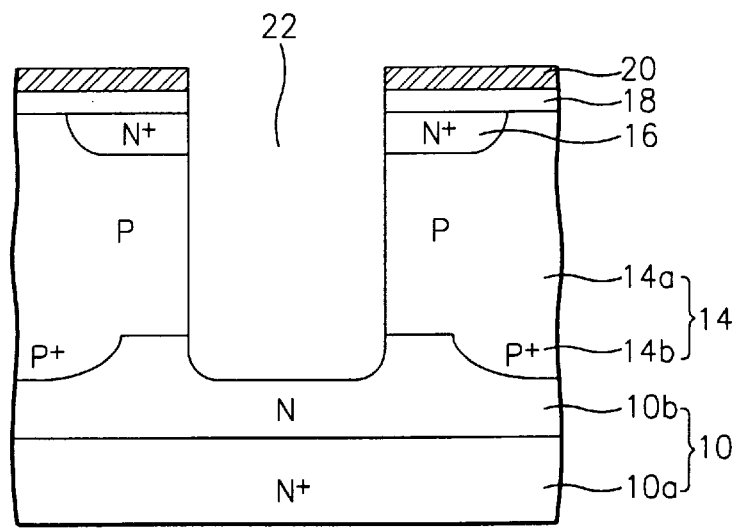
FIGS. 2A through 2C are diagrams showing successive process steps of a method for fabricating the trench DMOS device shown in FIG. 1.

Referring FIG. 2A, a semiconductor substrate 10 has an N+ type layer 10a and an N type layer 10b, which have been sequentially formed by implanting impurity ions therein. A P type epitaxial layer 14 is epitaxially formed on N type layer 10b. The epitaxial layer has a P type epitaxial layer 14a and a P+ type guard ring 14b formed at the bottom of epitaxial layer 14a. Next, an N+ type source region 16 is formed by injecting N+ impurity ions into epitaxial layer 14.

Subsequently, a thermal oxide layer 18 and a nitride layer 20 are sequentially formed on epitaxial layer 14, including N+ type source region 16. The thermal oxide layer is formed having a thickness of about 1000–3500A. The thermal oxide layer is used as a sacrificial oxidation layer so as to form a trench. Next, the nitride layer is patterned to form a nitride pattern.

An etching of the epitaxial layer and the thermal oxide layer is then performed using the nitride pattern as a mask, and thereby a trench 22 is formed on semiconductor substrate 10 passing through N+ type source region 16. Etching the trench results in a damage layer. Then a sacrificial layer is formed (not shown) to remove the damage layer. Then the sacrificial layer is removed using, for example, a BOE solution made in the ratio of 10:1.

As shown in FIG. 2A, trench 22 is in contact with N type layer 10b and includes a partially etched portion of it. Also, trench 22 is not in contact with P+ type guard ring 14b.

Figure 2B:
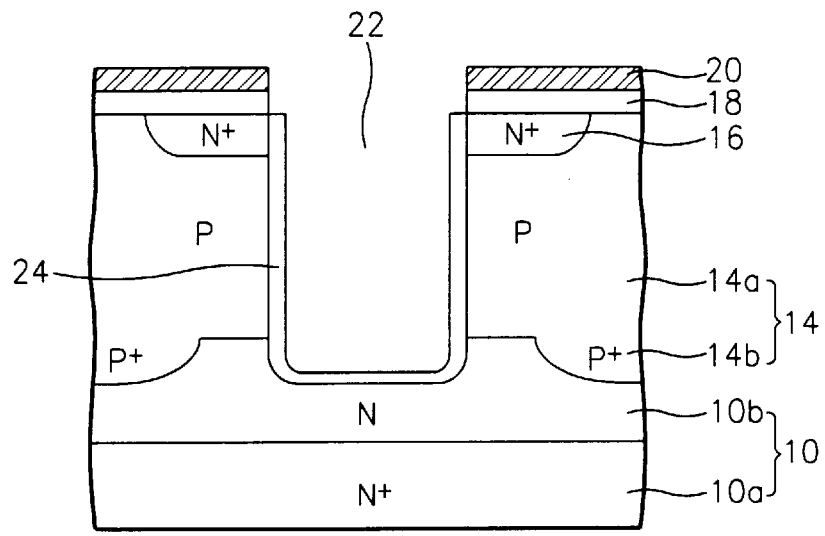

As shown in FIG. 2B, a gate oxide layer 24 about 1000 A thick is formed on the bottom and the sidewalls of the trench by oxidation. When the process for forming gate oxide layer 24 is complete, a thickness of about 1000 A is substantially attained at the sidewalls of the trench. However, the thickness of oxide formed at the bottom and bottom edges of the trench is substantially only about 600–700 A. As the bottom edges of trench 22 are acute, the oxide layer at the bottom or bottom edges of the trench is thinner. As a result, electrical characteristics of gate oxide layer 24 become very poor.

Figure 2C:
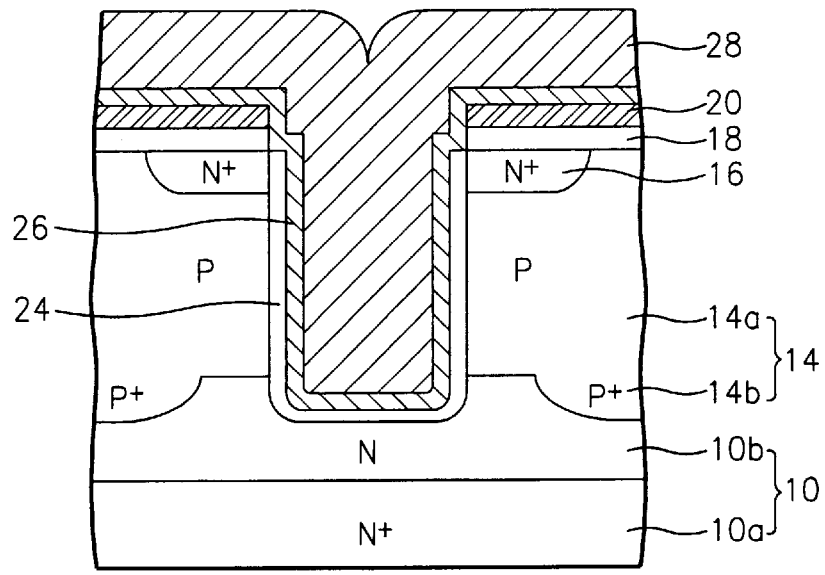

To solve the above described problem, two conductive layers having different crystallization are formed on gate oxide layer 24, as shown in FIG. 2C.

Finally, as shown in FIG. 2C, a first conductive layer, i.e., an amorphous silicon layer 26 having a thickness of about 500–1500 A is deposited on gate oxide layer 24 by a Low Pressure Chemical Vapor Deposition (LPCVD) method. During this deposition, amorphous silicon layer 26 is also deposited on nitride layer 20. Next, a second conductive layer having crystallization different from that of amorphous silicon layer 26, i.e., a polysilicon layer 28 for a gate electrode, is deposited on amorphous silicon layer 20, filling up the trench. The polysilicon layer has a thickness of about 1.15–1.25 μm.

In this embodiment, so as to render polysilicon layer 28 conductive, a $POCl_3$ doping process may be performed in a diffusion furnace, or an ion implantation may be performed.

In this embodiment, amorphous silicon layer 26 is formed in the temperature range of about 540–580° C. and in the pressure range of about 200–300 mTorr, and polysilicon layer 28 is formed in the thermal range of more than about 620° C.

As described above, since gate oxide layer 24 is in direct contact with amorphous silicon layer 26, distortion of gate oxide layer 24 is considerably reduced as compared to a conventional method. This is because amorphous silicon layer 26, having been deposited at less than about 580° C., has an amorphous structure, but it has larger grain than the polysilicon, which has been crystallized at a high temperature. Also, the grain of amorphous silicon has an equi-axial structure. Because the equi-axial structure is relatively stable to a columnar structure of the deposited polysilicon, gate oxide layer 24 becomes less damaged owing to a slight change in grain.

A subsequent planarization etching process removes the portion of layer 28 that is outside the trench. Then layer 20 is removed by a phosphoric acid strip process, and a thermal oxide layer 30 is deposited, as seen in FIG. 1.

Second Embodiment

Figure 3:
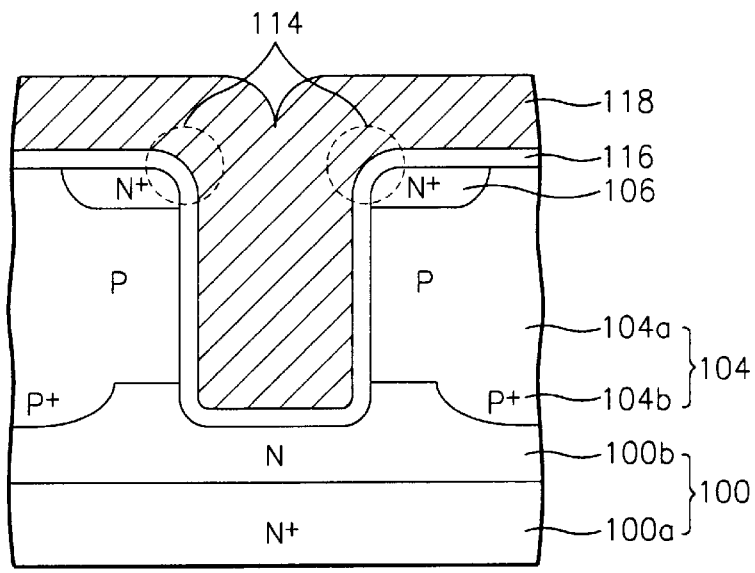
FIG. 3 is a cross-sectional view showing a trench DMOS device according to a second embodiment of the present invention.

FIG. 3 shows a trench DMOS device according to a second embodiment of the present invention.

Referring to FIG. 3, a trench DMOS device has a semiconductor substrate 100, wherein N+ and N type layers 100a and 100b are sequentially formed by impurity ions. An epitaxial layer 104 is formed on substrate 100, and an N+ type source region 106 is formed by implanting impurity ions into epitaxial layer 104.

A trench is formed passing through source region 106 and epitaxial layer 104, and reaching N type layer 100b. This trench has a round-shaped structure 114 at respective upper edges thereof. A gate oxide layer 116 is formed on the bottom and sidewalls of the trench and on the epitaxial layer 104. A polysilicon layer 118 for a gate electrode is filled in the trench and formed on gate oxide layer 116. As a result, a trench gate structure for the trench DMOS device is formed.

Since the trench is rounded at the top edges, electric field can be prevented from being concentrated in the gate oxide layer at the top edges of the trench. And a leakage current can be prevented from flowing at the top edge portions of the gate oxide layer formed on the trench.

Method for Fabricating the Second Embodiment

A method for fabricating the trench DMOS device of FIG. 3 is described with reference to FIGS. 4A through 4D.

Figure 4A:
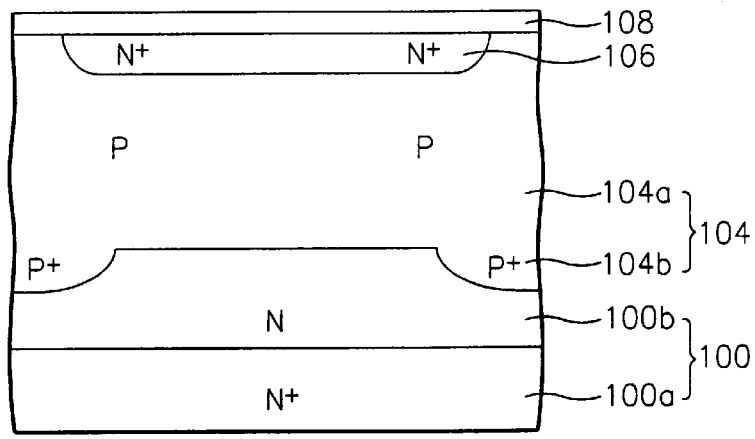
FIGS. 4A through 4D are diagrams showing successive process steps of a method for fabricating the trench DMOS device shown in FIG. 3.

Referring FIG. 4A, a semiconductor substrate 100 has an N+ type layer 100a and an N type layer 100b which are sequentially formed by implanting impurity ions therein. A P type epitaxial layer 104 is epitaxially formed on N type layer 104b. The epitaxial layer has a P type epitaxial layer 104a and a P+ type guard ring 104b formed at the bottom of layer 104a. Next, an N+ type source region 106 is formed by injecting impurity ions into epitaxial layer 104, and a thermal oxide layer 108 about 1000–3500 Å thick is formed over epitaxial layer 104, to be used as a sacrificial oxidation layer so as to form a trench.

Figure 4B:
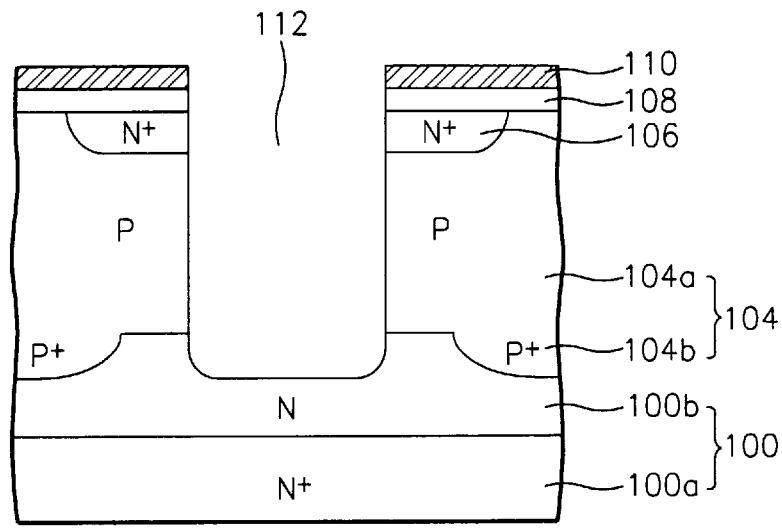

Subsequently, as shown in FIG. 4B, a photoresist layer 110 is deposited on thermal oxide layer 108 and patterned to form a photoresist pattern. An etching of thermal oxide layer 108 and epitaxial layer 104 is then performed using the photoresist pattern as a trench forming mask, to form a trench 112 on semiconductor substrate 100.

The trench defines a bottom and sidewalls, and passes through N+ type source region 106. As shown in FIG. 4A, trench 112 is in contact with N type layer 100b, and includes a partially etched portion of it. Also, trench 112 is not in contact with P+ type guard ring 104b.

Figure 4C:
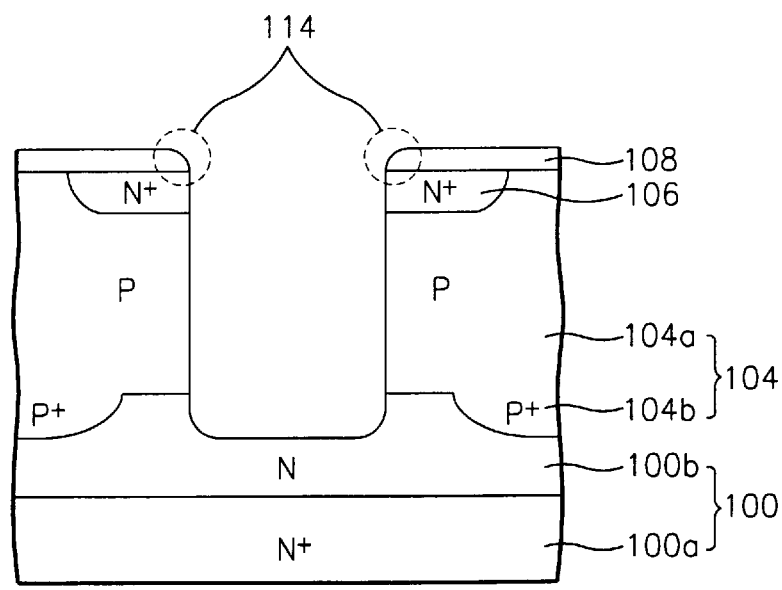

As shown in FIG. 4C, after removal of the photoresist pattern, a dry etching using argon (Ar) gas is performed on the upper edges of trench 112. This results in a round-shaped structure 114 being formed at the upper edges of trench 112.

Figure 4D:
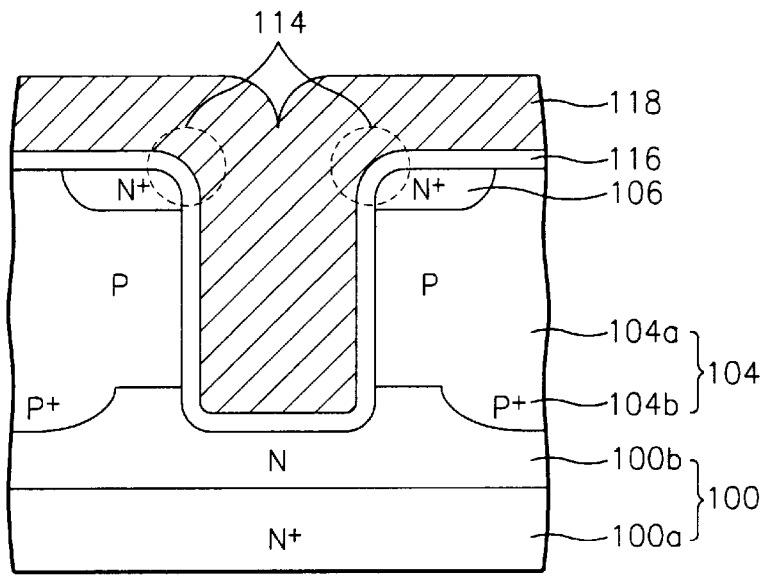

Finally, as shown in FIG. 4D, after removal of thermal oxide layer 108, a gate oxide layer 116 is formed on the bottom and the sidewalls of trench 112, including epitaxial layer 104. A polysilicon layer 118 for a gate electrode is deposited on gate oxide layer 116, filling up trench 112.

Third Embodiment

Figure 5:
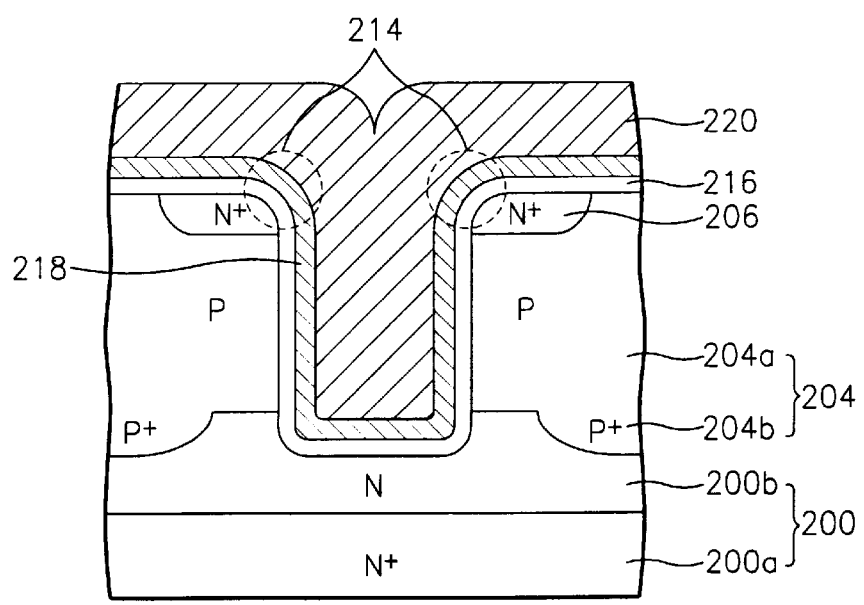
FIG. 5 is a cross-sectional view showing a trench DMOS device according to a third embodiment of the present invention.

FIG. 5 shows a trench DMOS device according to a third embodiment of the present invention.

Referring to FIG. 5, a trench DMOS device has a semiconductor substrate 200, wherein N+ and N type layers 200a and 200b are sequentially formed by impurity ions. An epitaxial layer 204 is formed on substrate 200, and an N+ type source region 206 is formed by implanting impurity ions into epitaxial layer 204.

A trench is formed passing through source region 206 and epitaxial layer 204, and reaching N type layer 200b. This trench has a round-shaped structure 214 at respective upper edges thereof. The trench defines a bottom and sidewalls.

A gate oxide layer 216 is formed on the bottom and sidewalls of the trench and on the epitaxial layer 204. An amorphous silicon layer 218 is formed on gate oxide layer 216. A polysilicon layer 220 for a gate electrode is filled in the trench and formed on amorphous silicon layer 218. As a result, a trench gate structure for the trench DMOS device is formed.

In this embodiment, the trench DMOS device can have the same effects as the trench DMOS devices according to the first and second embodiments.

Method for Fabricating the Third Embodiment

A method for fabricating the trench DMOS device of FIG. 5 is described with reference to FIGS. 6A through 6D.

Figure 6A:
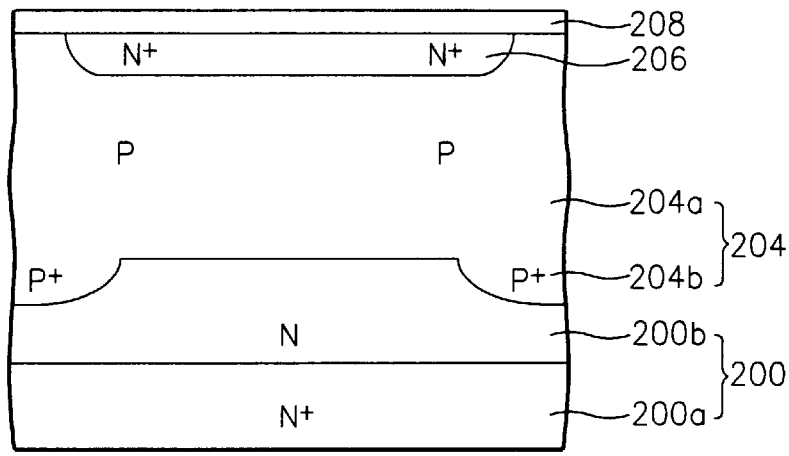
FIGS. 6A through 6D are diagrams showing successive process steps of a method for fabricating the trench DMOS device shown in FIG. 5.
Figure 6B:
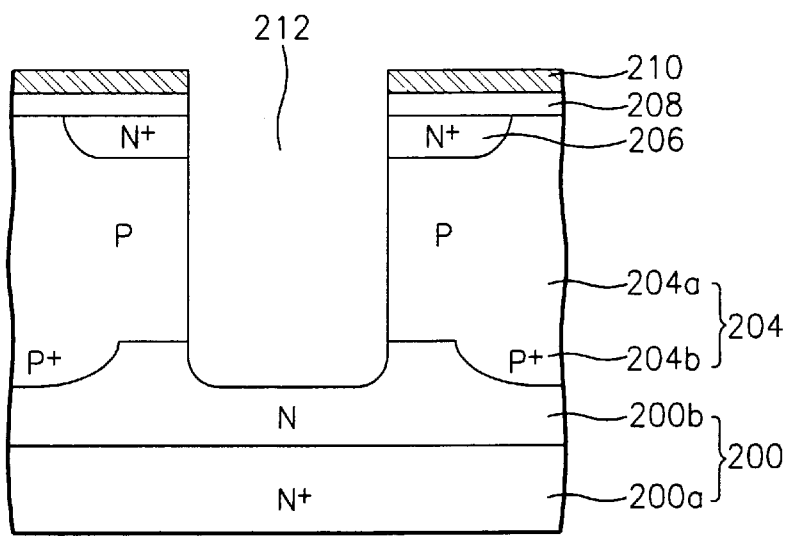
Figure 6C:
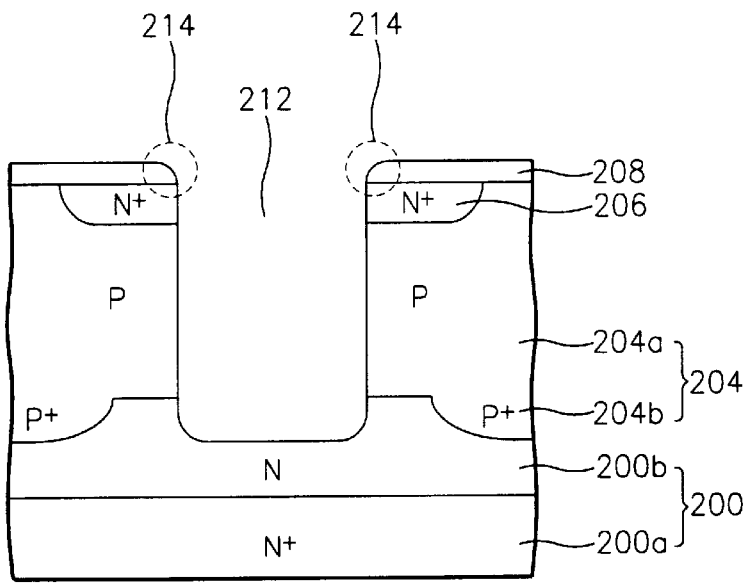

The process steps of FIGS. 6A through 6C are substantially the same as those of FIGS. 4A through 4C, and a description thereof is omitted in this section as superfluous.

Referring to FIG. 6C, thermal oxide layer 208 is then removed. (Layer 208 was used as a sacrificial oxidation layer so as to form a trench.)

Figure 6D:
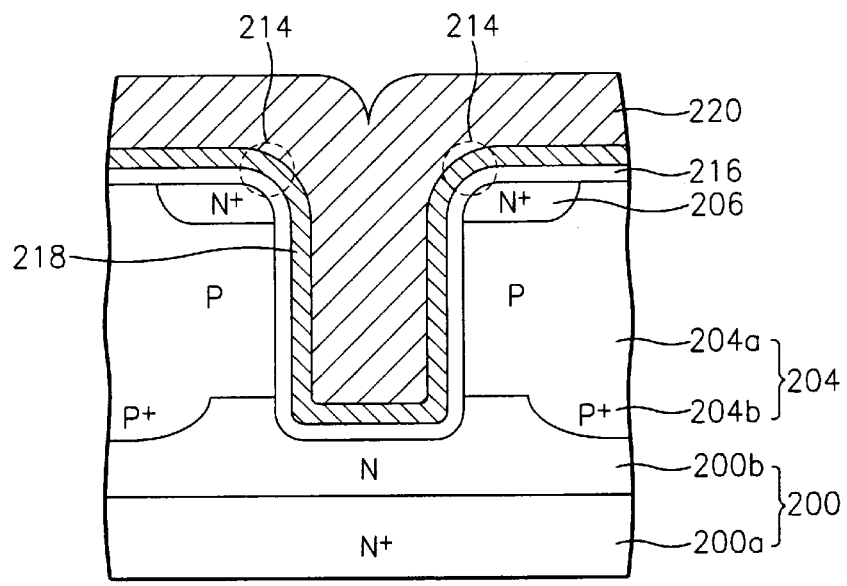

As shown in FIG. 6D, a gate oxide layer 216 is then formed on the bottom and sidewalls of the trench 212, including epitaxial layer 204.

Next, an amorphous silicon layer 216 about 500–1500 Å thick is deposited on gate oxide layer 216 using the LPCVD method. Deposition is performed in the temperature range of about 540–580° C., and in the pressure range of about 200–300 mTorr.

Then a polysilicon layer 220 for a gate electrode is deposited on gate oxide layer 216, filling up the trench. Gate polysilicon layer 220 is formed in the temperature range of higher than 620° C., and has a thickness of about 1.15–1.25 μm.

Although the preferred embodiment of the present invention has been disclosed for illustrative purposes, those skilled in the art will appreciate that various modifications, additions and substitutions are possible, without departing from the scope and spirit of the invention as described in the accompanying claims.

What is claimed is:

1. A trench DMOS device comprising:
   a semiconductor substrate having a trench therein, the trench defining a bottom and sidewalls;
   a gate insulating layer formed on the bottom and the sidewalls;
   a first conductive layer formed on substantially all of the gate insulating layer, said first conductive layer formed over an upper edge of the trench; and
   a second conductive layer formed on the first conductive layer, filling in the trench, and having a different crystallization from the first conductive layer.

2. The trench DMOS device according to claim 1, wherein the first conductive layer is an amorphous silicon layer and the second conductive layer is a polysilicon layer.

3. The trench DMOS device according to claim 1, wherein said first conductive layer has been formed by low pressure chemical vapor deposition.

4. The trench DMOS device according to claim 1, wherein the first conductive layer has a thickness of about 500–1500 Å.

5. The trench DMOS device according to claim 1, wherein the first conductive layer has been formed in the temperature range of about 540–580° C.

6. The trench DMOS device according to claim 1, wherein the first conductive layer has been formed in the pressure range of 200–300 mTorr.

7. The trench DMOS device according to claim 1, wherein the second conductive layer has a thickness of about 1.15–1.25 μm.

8. The trench DMOS device according to claim 1, wherein the second conductive layer has been formed at a temperature of about 620° C.

9. A trench DMOS device comprising:
   a semiconductor substrate of a first conductivity type;
   an epitaxial layer of a second conductivity type formed on the semiconductor substrate, the second conductivity type being different than the first conductivity type;
   a trench formed in the semiconductor substrate and passing through the epitaxial layer, the trench defining a bottom and sidewalls;
   an impurity injection region of the first conductivity type formed on opposite sides of a top of the trench;
   a gate oxide layer formed on the bottom and the sidewalls;
   an amorphous silicon layer formed on substantially all of the gate oxide layer; and
   a polysilicon layer filled in the trench and formed on the amorphous silicon layer.

10. A trench DMOS device comprising:

a semiconductor substrate of a first conductivity type;

an epitaxial layer of a second conductivity type formed on the semiconductor substrate, the second conductivity type being different than the first conductivity type;

a trench formed in the semiconductor substrate passing through the epitaxial layer, said trench having a round-shaped structure at both side edges of a top thereof, the trench having formed on a bottom and sidewalls thereof a gate oxide layer, the gate oxide layer having formed thereon an amorphous silicon layer and the amorphous silicon layer having formed thereon a polysilicon layer, the polysilicon substantially filling the trench; wherein the amorphous silicon layer formed on substantially all of the gate oxide layer, and an impurity injection region of the first conductivity type formed on both sides of the top of the trench.

11. The trench DMOS device according to claim 10, wherein the round-shaped structure is formed by etching using argon gas.

12. A trench DMOS device comprising:

a semiconductor substrate of a first conductivity type;

an epitaxial layer of a second conductivity type formed on the semiconductor substrate, the second conductivity type being different than the first conductivity type;

a trench formed in the semiconductor substrate passing through the epitaxial layer, said trench having a round-shaped structure at both side edges of a top thereof;

an impurity injection region of the first conductivity type formed on both sides of the top of the trench;

a gate oxide layer formed on a bottom and both sidewalls of the trench;

an amorphous silicon layer formed on substantially all of the gate oxide layer; and a polysilicon layer filled into the trench and on the amorphous silicon layer.

13. The trench DMOS device according to claim 1, wherein the epitaxial layer includes a guard ring at a bottom thereof.

14. The trench DMOS device according to claim 9, wherein the epitaxial layer includes a guard ring at a bottom thereof.

* * * * *